(12) United States Patent
Kanaoka et al.

(10) Patent No.: US 7,620,873 B2
(45) Date of Patent: Nov. 17, 2009

(54) ENCODER, DECODER, METHODS OF ENCODING AND DECODING

(75) Inventors: Toshikazu Kanaoka, Kawasaki (JP); Toshihiko Morita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 440 days.

(21) Appl. No.: 11/385,493

(22) Filed: Mar. 21, 2006

(65) Prior Publication Data

US 2007/0143657 A1    Jun. 21, 2007

(30) Foreign Application Priority Data

Dec. 15, 2005   (JP) .............................. 2005-362340

(51) Int. Cl.
*H03M 13/00*    (2006.01)
(52) U.S. Cl. .................. 714/752; 714/728; 714/758
(58) Field of Classification Search ................ 714/752, 714/728, 792, 758, 774, 755, 780, 753
See application file for complete search history.

(56) References Cited

U.S. PATENT DOCUMENTS

| 6,668,349 | B1* | 12/2003 | Sawaguchi | 714/755 |
|---|---|---|---|---|
| 6,757,122 | B1 | 6/2004 | Kuznetsov et al. | |
| 6,769,091 | B2* | 7/2004 | Classon et al. | 714/792 |
| 6,895,547 | B2 | 5/2005 | Eleftheriou et al. | |
| 2004/0158791 | A1* | 8/2004 | Sawaguchi | 714/753 |
| 2005/0193320 | A1* | 9/2005 | Varnica et al. | 714/800 |
| 2005/0257119 | A1 | 11/2005 | Blankenship et al. | |
| 2005/0283708 | A1* | 12/2005 | Kyung et al. | 714/758 |

FOREIGN PATENT DOCUMENTS

WO     WO 2005/036758        4/2005

OTHER PUBLICATIONS

Fan, John L., "Array Codes as Low-Density Parity-Check Codes", in Proc. $2^{nd}$ Int. Symp. Turbo Codes, Brest, France, Sep. 2000, p. 543.
Yang, M., Ryan, W.E., Li, Y., "Design of efficiently encodable moderate-length high-rate irregular LDPC codes," IEEE Trans. Comm., vol. 52, No. 4, Apr. 2004, pp. 564-571.
Yang, M. et al., "Design of Efficiently Encodable Moderate-Length High-Rate Irregular LDPC Codes", IEEE Transactions on Communications, IEEE Service Center, Piscataway, NJ, USA, vol. 52, No. 4, pp. 564-571, Apr. 2004.
Hongxin Song et al., "Low Density Parity Check Codes for Magnetic Recording Channels", IEEE Transactions on Magnetics, IEEE Service Center, New York, NY, USA, vol. 36, No. 5, Sep. 2000.

(Continued)

*Primary Examiner*—Esaw T Abraham
*Assistant Examiner*—Fritz Alphonse
(74) *Attorney, Agent, or Firm*—Greer, Burns & Crain, Ltd.

(57) ABSTRACT

An information sequence having a code length of N (N=K+M), where K is information length and M is parity length, is encoded into a code sequence by using an LDPC code. The LDPC code is generated based on a matrix H, with M rows and N columns. The matrix H includes a check matrix $H_2$ and a check matrix $H_1$. The check matrix $H_2$ has M rows and M columns, it is a cyclic permutation matrix, and an inverse matrix exists for the check matrix $H_2$, and its column weight is 3. The check matrix $H_1$ has M rows and K columns.

20 Claims, 9 Drawing Sheets

OTHER PUBLICATIONS

Yu Yi et al.; "The Semi-Algebra Low-Density Parity-Check Codes;" IEEE International Conference on Paris, France; Jun. 20-24, 2004, Piscataway, NJ; USA, IEEE, vol. 1, pp. 440-443; Jun. 20, 2004.

David Haley et al.; "Iterative Encoding of Low-Density Parity-Check Codes;" IEEE Global Telecommunications Conference; Conference Proceedings, Taipei, Taiwan, Nov. 17-21, 2002; IEEE Global telecommunications Conference, NY, NY; vol. 2, pp. 1289-1293; Nov. 17, 2002.

* cited by examiner

FIG.1

P IS PRIME NUMBER (P=5)

$$H_1 = \begin{bmatrix} I & I & I & I & I \\ I & \sigma & \sigma^2 & \sigma^3 & \sigma^4 \\ I & \sigma^2 & \sigma^4 & \sigma^6 & \sigma^8 \\ I & \sigma^3 & \sigma^6 & \sigma^9 & \sigma^{12} \\ I & \sigma^4 & \sigma^8 & \sigma^{12} & \sigma^{16} \end{bmatrix} = \begin{bmatrix} I & I & I & I & I \\ I & \sigma & \sigma^2 & \sigma^3 & \sigma^4 \\ I & \sigma^2 & \sigma^4 & \sigma & \sigma^3 \\ I & \sigma^3 & \sigma & \sigma^4 & \sigma^2 \\ I & \sigma^4 & \sigma^3 & \sigma^2 & \sigma \end{bmatrix}$$

$$\sigma = \begin{bmatrix} 0 & 0 & 0 & 1 & 0 \\ 0 & 0 & 1 & 0 & 0 \\ 0 & 1 & 0 & 0 & 0 \\ 1 & 0 & 0 & 0 & 0 \\ 0 & 0 & 0 & 0 & 1 \end{bmatrix}$$

P IS NON-PRIME NUMBER (P=6)

$$H_1 = \begin{bmatrix} I & I & I & I & I \\ I & \sigma & \sigma^2 & \sigma^3 & \sigma^4 \\ I & \sigma^2 & \sigma^4 & \sigma^6 & \sigma^8 \\ I & \sigma^3 & \sigma^6 & \sigma^9 & \sigma^{12} \\ I & \sigma^4 & \sigma^8 & \sigma^{12} & \sigma^{16} \end{bmatrix} \Rightarrow \begin{bmatrix} I & I & I & I & I \\ I & \sigma & \sigma^2 & \sigma^3 & \sigma^4 \\ I & \sigma^2 & \sigma^4 & I & \sigma^2 \\ I & \sigma^3 & I & \sigma^3 & I \\ I & \sigma^4 & \sigma^2 & I & \sigma^4 \end{bmatrix}$$

4 CYCLE OCCURS $$\sigma = \begin{bmatrix} 0 & 0 & 0 & 0 & 1 & 0 \\ 0 & 0 & 0 & 1 & 0 & 0 \\ 0 & 0 & 1 & 0 & 0 & 0 \\ 0 & 1 & 0 & 0 & 0 & 0 \\ 1 & 0 & 0 & 0 & 0 & 0 \\ 0 & 0 & 0 & 0 & 0 & 1 \end{bmatrix}$$

FIG.2

$$H_{array} = \begin{bmatrix} H_1 \ (16 \times 24) \end{bmatrix} \ (21 \times 28)$$

FIG.3D $$H = \begin{bmatrix} 1 & 0 & 0 & 1 & 0 & 0 & 1 & 0 & 0 \\ 0 & 1 & 0 & 0 & 1 & 0 & 0 & 1 & 0 \\ 0 & 0 & 1 & 0 & 0 & 1 & 0 & 0 & 1 \\ 1 & 0 & 0 & 0 & 1 & 0 & 1 & 0 & 0 \\ 0 & 1 & 0 & 0 & 0 & 1 & 0 & 0 & 1 \\ 0 & 0 & 1 & 1 & 0 & 0 & 0 & 1 & 0 \end{bmatrix}$$

CODE LENGTH N

PARITY LENGTH M

ENCODER, DECODER, METHODS OF ENCODING AND DECODING

BACKGROUND OF THE INVENTION

1. Field of the Invention

The present invention relates to an encoder that encodes information using a low-density parity-check (LDPC) code and a decoder that decodes the encoded information using the LDPC code. More specifically, the present invention relates to an encoder that encodes information using an array code and a decoder that decodes the encoded information.

2. Description of the Related Art

Low-density parity-check (LDPC) codes are attracting attention as error correction technology. The LDPC code is advantageous in that it is a linear code having fewer "1"s in a check matrix. Because the code length is higher and the codes have randomness, the LDPC code has significantly higher error correction ability than the conventional code. With the LDPC code it is possible to efficiently decode a code sequence using an iterative decoding method called a Sum-Product decoding method.

The LDPC code is applied to detect errors in magnetic disk devices. An LDPC code that can be used to detect errors in magnetic disk devices need to have, for example, satisfactory waterfall characteristic, low error floor, short parity length, high encoding rate, short code length, and it should be a systematic code. Moreover, circuit scales of an encoder and a decoder should be small. An LDPC code that can fulfill all of these requirements has yet to be developed.

The systematic code is a code generated by generating a parity sequence from an information sequence and adding the parity sequence to the information sequence. FIG. 6 is a diagram for explaining the systematic code.

As shown in FIG. 6, this systematic code is a code for generating a code sequence by adding a parity sequence, a parity length of which is M, to an information sequence, an information length of which is K. A code length of the code sequence is N (N=K+M).

FIG. 7 is a diagram of a functional constitution of an encoding/decoding section of a magnetic disk device that uses the conventional LDPC code system. As shown in FIG. 7, this encoding/decoding section includes an LDPC encoder 1, a Partial Response (PR) channel 2, a channel A Posteriori Probability (APP) decoder 3, an LDPC decoder 4, and a threshold judging unit 5.

The LDPC encoder 1 is an encoder that encodes an inputted information sequence $u_k$ into an LDPC code sequence $x_k$. The PR channel 2 is a channel that records the LDPC code sequence $x_k$ encoded by the LDPC encoder 1 in a magnetic disk according to a partial response system, reproduces information $y_k$ recorded in the magnetic disk, and outputs the information $y_k$ reproduced to the channel APP decoder 3.

The channel APP decoder 3 is a decoder that applies Maximum Likelihood (ML) decoding to the information $y_k$ received from the PR channel 2 and outputs external information $\Lambda_e(x_k')$ with respect to the LDPC code sequence $x_k$ to the LDPC decoder 4 as a logarithmic likelihood ratio.

The LDPC decoder 4 is a decoder that performs reliability propagation operation with the external information $\Lambda_e(X_k')$ as a priori likelihood, updates the external information $\Lambda_e(x_k')$ with respect to the LDPC code sequence $X_k$, and calculates a posteriori probability $\Lambda(u_k')$ of an estimated value $u_k'$ with respect to the information sequence uk based on the e xternal information $\Lambda_e(X_k')$.

This LDPC decoder 4 outputs the external information $\Lambda_e(x_k')$ updated to the channel APP decoder 3 such that the external information $\Lambda_e(x_k')$ is used as a priori information. The LDPC decoder 4 repeats the processing a predetermined number of times and, then, outputs information on the a posteriori probability $\Lambda(u_k')$ to the threshold judging unit 5.

The threshold value judging unit 5 can obtain the estimated value $u_k'$ with respect to the information sequence $u_k$ by acquiring the information on the a posterior probability $\Lambda(u_k')$ from the LDPC decoder 4 and performing threshold judgment for the a posteriori probability $\Lambda(u_k')$.

The LDPC code is a linear block code and defined by a check matrix H. FIG. 8 is a diagram of an example of the check matrix H. When the code length is N and the parity length is M, the check matrix H has M rows and N columns.

The check matrix H and a code matrix x are related as follows:

$$Hx^T=0$$

where x is an N-dimensional vector, 0 is an N-dimensional zero vector, and T represents transposition of x.

When the code sequence x is generated from the information sequence u, a generator matrix G described below is used:

$$x=uG$$

where the information sequence u is a K-dimensional vector and the generator matrix G is a matrix with K rows and N columns.

The generator matrix G has a relation described below with the information sequence u, the code sequence x, and the check matrix H.

$$HG^T=0$$

where 0 is a zero matrix with M rows and K columns.

If the check matrix H and the generator matrix G are held in a memory in a Large Scale Integration (LSI) included in a hard disk device, the circuit scale of the LSI becomes large. Therefore, examinations have been performed to make it possible to easily hold structures of these matrixes in the LSI or easily generate these matrixes.

For example, as a method of structuring the check matrix H, there is a method that uses an array code. In an array-LDPC code obtained by applying the array code to the LDPC code, the check matrix H is structured using a cyclic permutation matrix (see, for example, John L. Fan, "Array Codes as Low-Density Parity-Check Codes", in Proc. $2^{nd}$. Int. Symp. Turbo Codes, Brest, France, September 2000, pp. 543-546).

An example of the check matrix H of the array-LDPC code is shown below:

$$H = \begin{bmatrix} I & I & I & \cdots & I \\ I & \sigma & \sigma^2 & \cdots & \sigma^{k-1} \\ I & \sigma^2 & \sigma^4 & \cdots & \sigma^{2(k-1)} \\ \vdots & \vdots & \vdots & \ddots & \vdots \\ I & \sigma^{j-1} & \sigma^{2(j-1)} & \cdots & \sigma^{(j-1)(k-1)} \end{bmatrix}$$

where I is a unit matrix with p rows and p columns (p is a prime number: p=1, 3, 5, 7, 11, . . . ). j and k are a column weight and a row weight of the check matrix H, respectively, and satisfy a relation of j, k≦p.

σ is a cyclic permutation matrix with p rows and p columns obtained by moving "1"s of the unit matrix I in a row or column direction. An example of σ is shown below:

$$\sigma = \begin{bmatrix} 0 & 1 & 0 & 0 & 0 \\ 0 & 0 & 1 & 0 & 0 \\ 0 & 0 & 0 & 1 & 0 \\ 0 & 0 & 0 & 0 & 1 \\ 1 & 0 & 0 & 0 & 0 \end{bmatrix}$$

The array-LDPC code has a characteristic that there is no cycle, length of which is 4, in a Tanner graph and it is possible to prevent deterioration in decoding performance and structure the check matrix H. However, the generator matrix G has a disadvantage that, in general, the generator matrix G does not have a specific structure.

Therefore, a method of recursively performing encoding of an information sequence using a structured check matrix has also been proposed. However, computational complexity at the time of encoding increases (see, for example, U.S. Pat. No. 6,895,547 specification).

An Irregular Repeat-Accumulate (IRA)-LDPC code that holds down computational complexity at the time of encoding and realizes a low error floor has also been proposed (see, for example, M. Yang, W. E. Ryan, and Y. Li, "Design of efficiently encodable moderate-length high-rate irregular LDPC codes," IEEE Trans. Comm., Vol. 52, No. 4, pp. 564-571, April 2004).

In this IRA-LDPC code, the check matrix H with M rows and N columns is divided into a square matrix $H_2$ with M rows and M columns and a matrix $H_1$ with the remaining M rows and K columns (K=N−M).

$H=[H_1 H_2]$

In this case, the generator matrix G is represented as follows.

$G=[I(H_2^{-1}H_1)^T]$

In the IRA-LDPC code, the check matrix $H_1$ is a matrix generated at random (a random interleaver) and the check matrix H2 has a structure of 1+D (D means delay of 1) represented as follows.

$$H_2 = \begin{bmatrix} 1 & 0 & 0 & 0 & 0 & 0 \\ 1 & 1 & 0 & 0 & 0 & 0 \\ 0 & 1 & 1 & 0 & 0 & 0 \\ 0 & 0 & 1 & 1 & 0 & 0 \\ 0 & 0 & 0 & 1 & 1 & 0 \\ 0 & 0 & 0 & 0 & 1 & 1 \end{bmatrix}$$

where, "+" is an exclusive OR operator.

FIG. 9 is a diagram for explaining an encoder that performs the conventional IRA-LDPC encoding. As shown in FIG. 9, this encoder multiplies the information sequence u by a check matrix $H_1^T$ and applies a transfer function 1/(1+D) to an output of the multiplication to thereby generate a parity sequence p from the information sequence u.

However, if the conventional IRA-LDPC code is applied to an apparatus that permits intersymbol interference, like a magnetic disk device using the partial response system, if there is a portion where "1" continues in the check matrix H, error rate characteristic is not satisfactory.

Specifically, a column weight of the check matrix $H_2$ in the IRA-LDPC code is 2. When there is intersymbol interference, error propagation among bits tends to occur and a decline in error correction ability is inevitable. It is generally known that the LDPC code, a column weight of which is 2, is poor in error floor characteristic.

Therefore, there is a need of a technology that can control deterioration in error rate characteristic, reduce computational complexity related to encoding and decoding, and reduce circuit scales of an encoding circuit and a decoding circuit while structuring a check matrix.

SUMMARY OF THE INVENTION

It is an object of the present invention to at least solve the problems in the conventional technology.

According to an aspect of the present invention, an encoder that encodes information sequence having a code length of N (N=K+M), where K is information length and M is parity length, into a code sequence by using a low-density parity-check (LDPC) code, includes an information acquiring unit that acquires information concerning a generator matrix of an LDPC code defined by a check matrix with M rows and N columns formed by a first matrix with M rows and M columns that is a cyclic permutation matrix, an inverse matrix of which exists and a column weight of which is 3, and a second matrix with M rows and K columns; and an encoding unit that encodes predetermined information sequence into a code sequence based on the information acquired by the information acquiring unit.

According to another aspect of the present invention, an encoder that encodes an information sequence using an array code, includes an information acquiring unit that acquires information concerning a generator matrix defined by a check matrix formed by a matrix obtained by subjecting two "1"s on rows adjacent to each other in a cyclic permutation matrix that forms a check matrix in the array code to row or column permutation arrangement to be arranged predetermined columns apart from each other; an encoding unit that encodes the information sequence into a code sequence based on the information acquired by the information acquiring unit.

According to still another aspect of the present invention, a decoder that adds a parity sequence, a parity length of which is M, to a predetermined information sequence, an information length of which is K, to thereby decode the code sequence, a code length of which is N (N=K+M), encoded using a low-density parity-check (LDPC) code, includes an information acquiring unit that acquires information concerning a check matrix with M rows and N columns of an LDPC code defined by the check matrix formed by a first matrix with M rows and M columns that is a cyclic permutation matrix, an inverse matrix of which exists and a column weight of which is 3, and a second matrix with M rows and K columns; and a decoding unit that decodes a code sequence based on the information acquired by the information acquiring unit.

According to still another aspect of the present invention, a method of encoding including adding a parity sequence, a parity length of which is M, to a predetermined information sequence, an information length of which is K, to thereby encoding the information sequence into a code sequence, a code length of which is N (N=K+M), using a low-density parity-check (LDPC) code, includes acquiring information concerning a generator matrix of an LDPC code defined by a check matrix with M rows and N columns formed by a first matrix with M rows and M columns that is a cyclic permutation matrix, an inverse matrix of which exists and a column weight of which is 3, and a second matrix with M rows and K columns; and encoding predetermined information sequence into a code sequence based on the information acquired at the acquiring.

According to still another aspect of the present invention, a method of decoding including adding a parity sequence, a parity length of which is M, to a predetermined information sequence, an information length of which is K, to thereby decode the code sequence, a code length of which is N (N=K+M), encoded using a low-density parity-check (LDPC) code, includes acquiring information concerning a check matrix with M rows and N columns of an LDPC code defined by the check matrix formed by a first matrix with M rows and M columns that is a cyclic permutation matrix, an inverse matrix of which exists and a column weight of which is 3, and a second matrix with M rows and K columns; and decoding a code sequence based on the information acquired at the acquiring.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 1 is a diagram for explaining a cause of occurrence of a 4 cycle according to a first embodiment of the present invention;

FIG. 2 is a diagram for explaining a method of generating a check matrix $H_1$ according to the first embodiment;

Figure 3A:
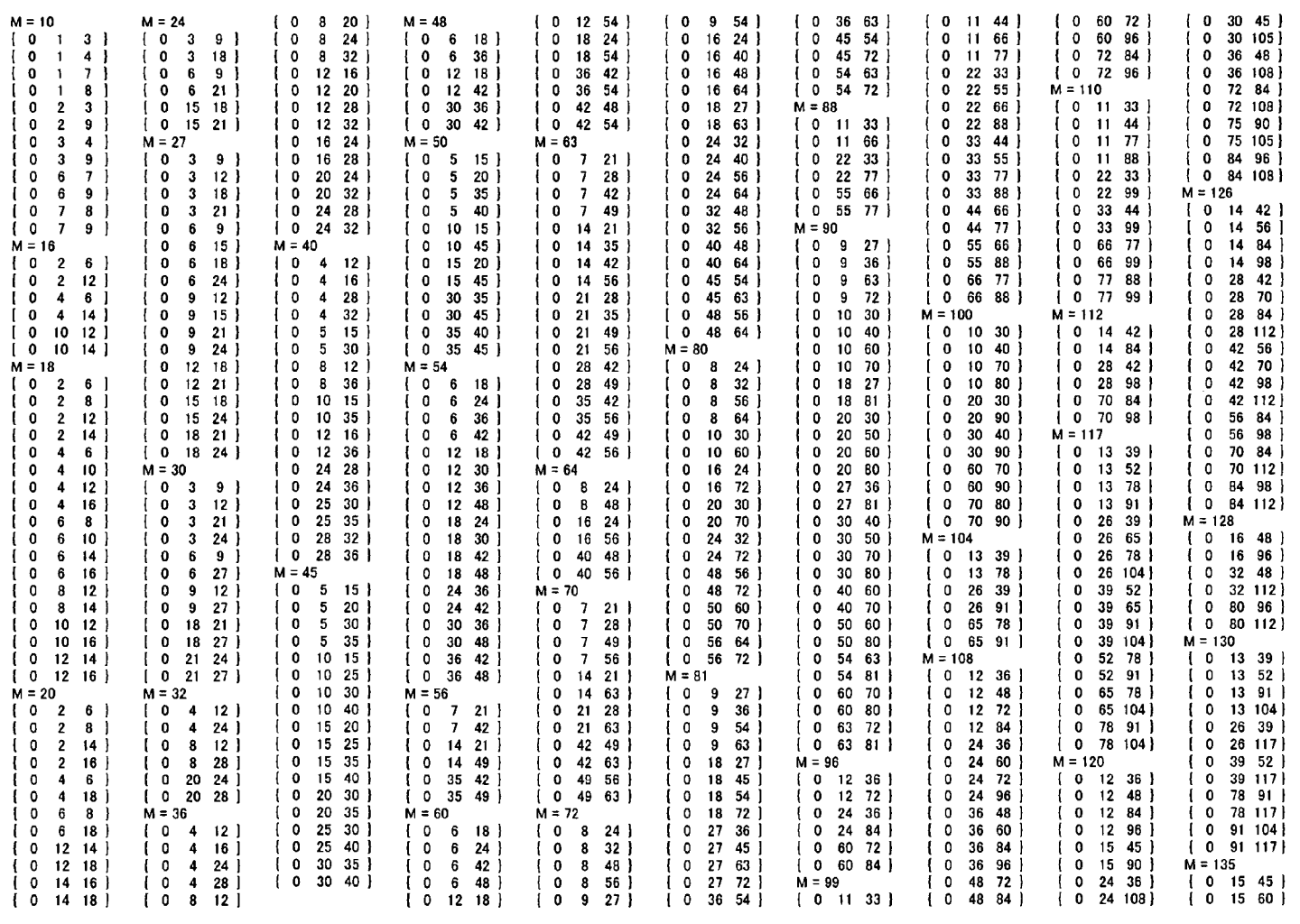
Figure 3B:
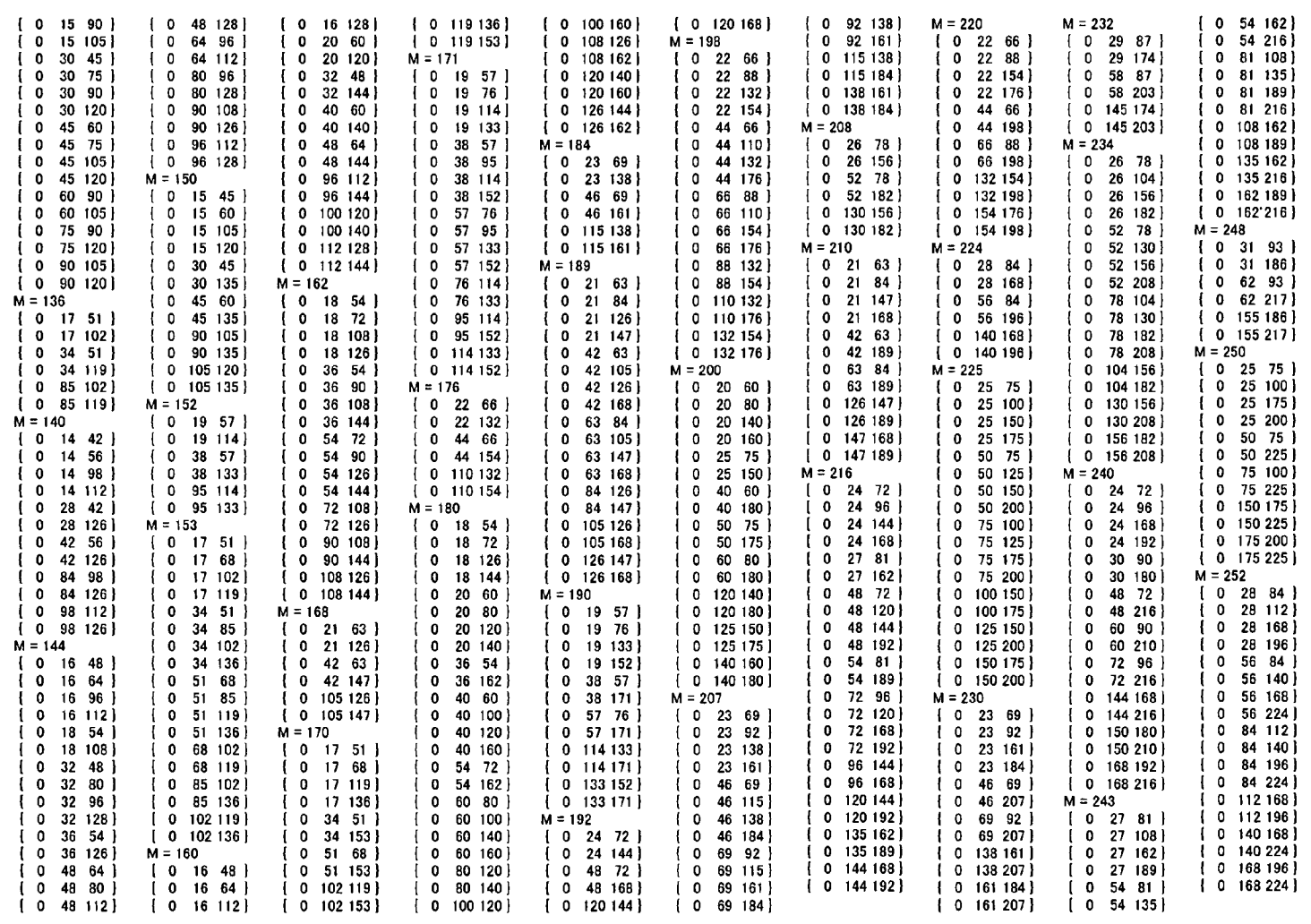
Figure 3C:
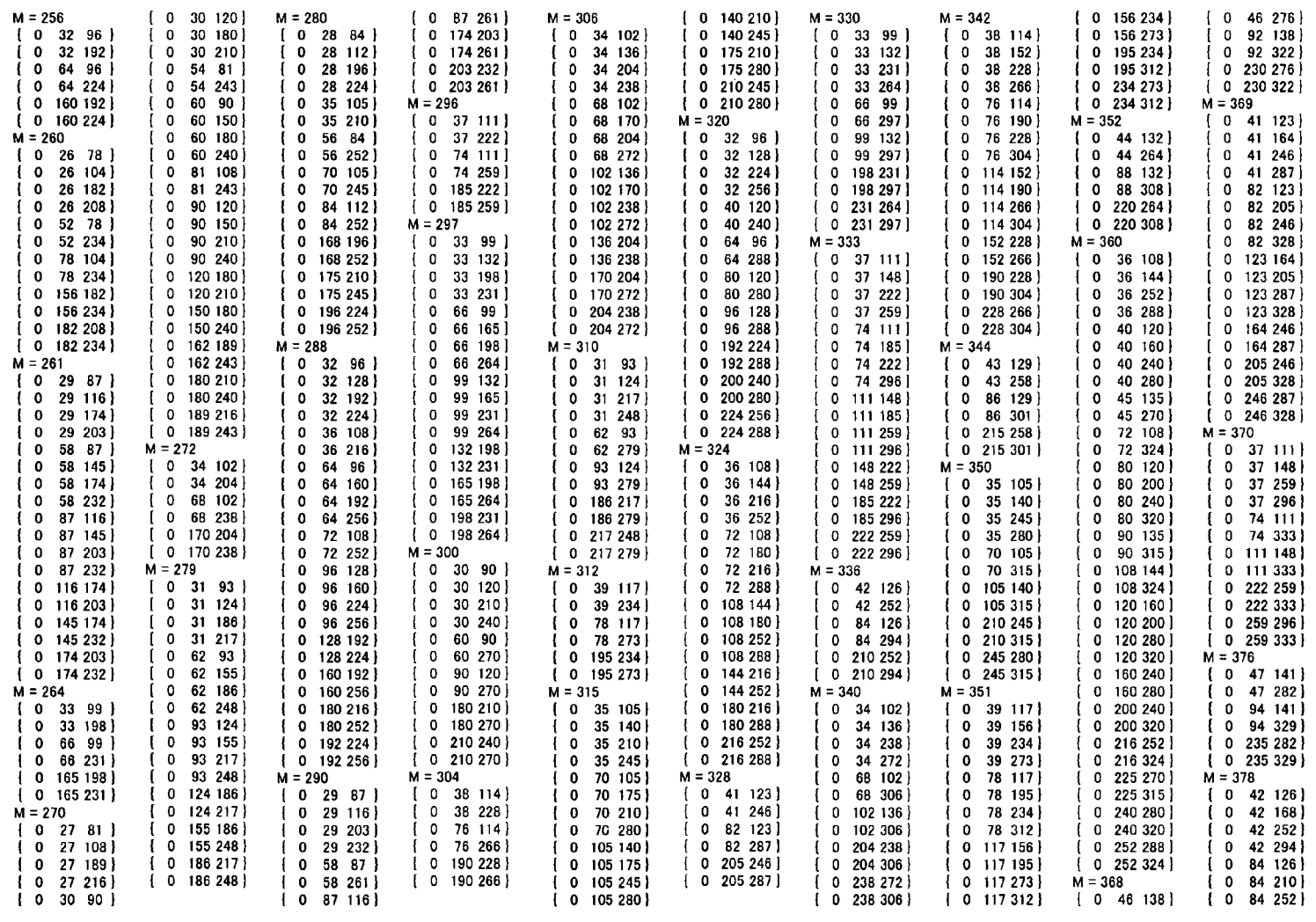
Figure 3D:
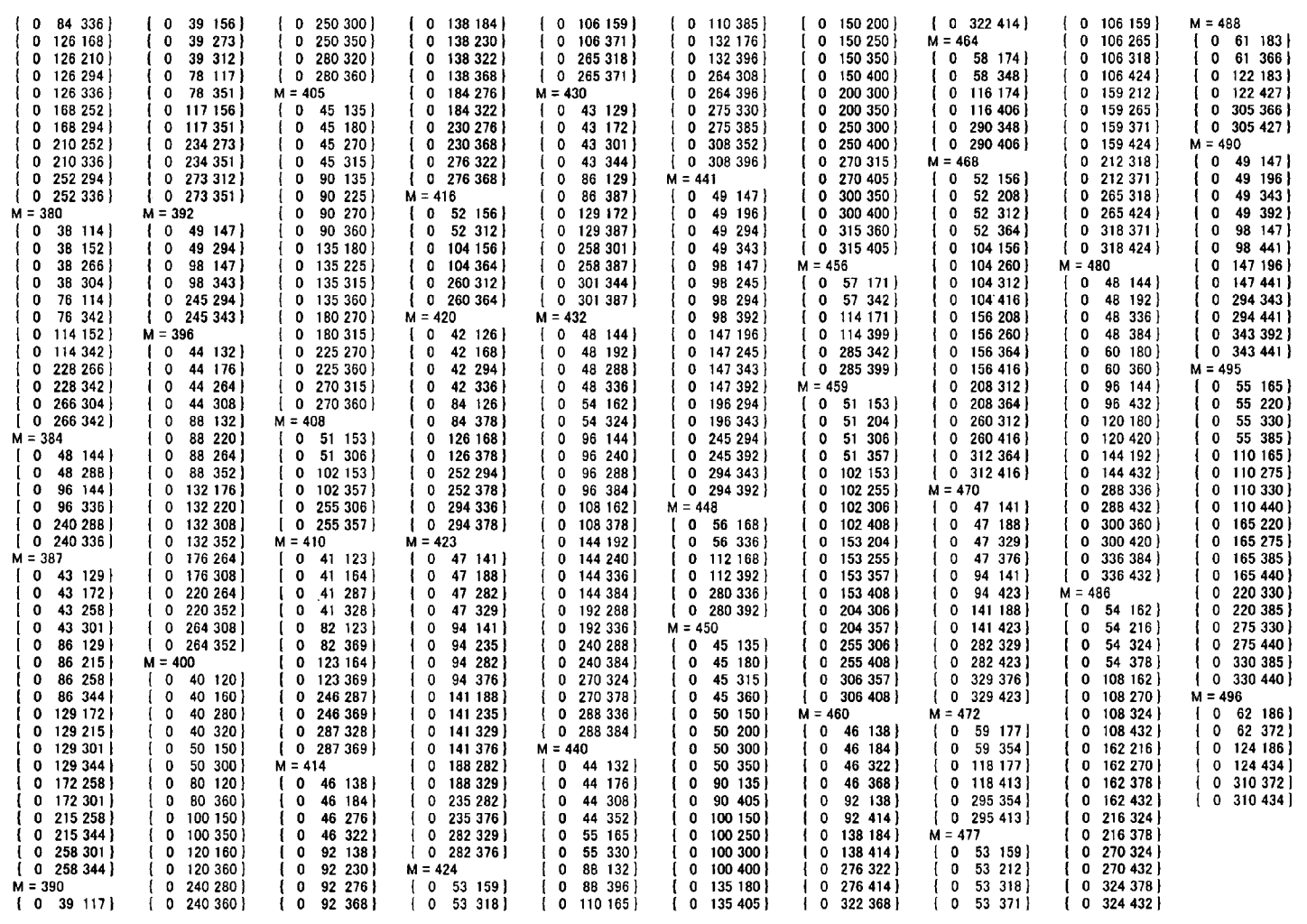

FIGS. 3A to 3D are diagrams of initial value columns corresponding to various parity lengths;

DETAILED DESCRIPTION OF THE PREFERRED EMBODIMENTS

Figure 4:
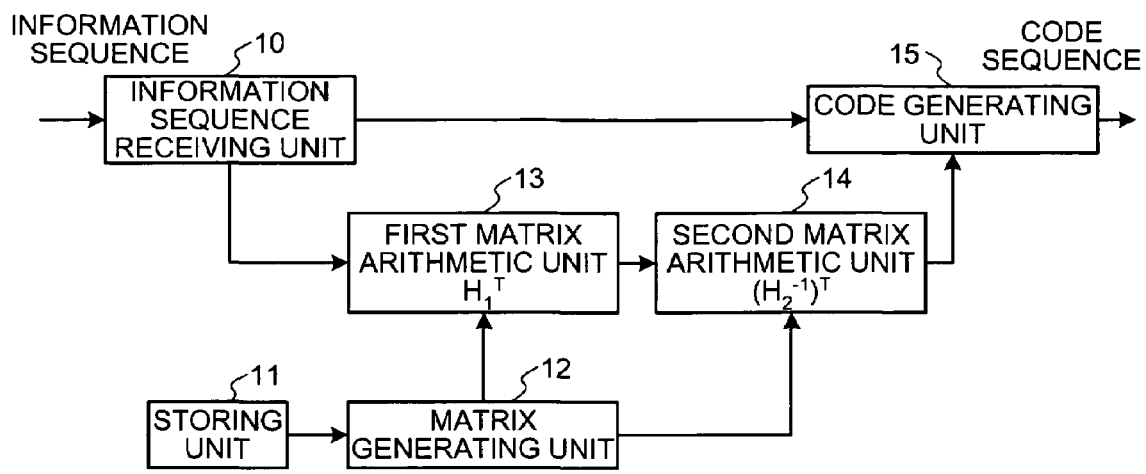
FIG. 4 is a functional block diagram of an encoder according to the first embodiment.

Exemplary embodiments of the present invention are explained in detail below with reference to the accompanying drawings.

In an LDPC code according to a first embodiment of the present invention, a check matrix H with M rows and N columns is formed of two matrixes, namely, a check matrix $H_2$ that is a square matrix with M rows and M columns and a check matrix $H_1$ with the remaining M rows and K columns (K=N−M) as shown below:

$$H = [H_1 H_2].$$

A generator matrix G can be represented as follows:

$$G = [I (H_2^{-1} H_1)^T].$$

In other words, $$\begin{aligned} HG^T &= [H_1 \ H_2] \left[ I \ (H_2^{-1} \ H_1)^T \right]^T \\ &= H_1 I + H_2(H_2^{-1} \ H_1) \\ &= H_1 + H_1 \\ &= 0. \end{aligned}$$

"+" is an exclusive OR operator.

An array code is used for the check matrix $H_1$. In this case, the check matrix $H_1$ is represented as follows.

$$H_1 = \begin{bmatrix} I & I & I & \cdots & I \\ I & \sigma & \sigma^2 & \cdots & \sigma^{k-1} \\ I & \sigma^2 & \sigma^4 & \cdots & \sigma^{2(k-1)} \\ \vdots & \vdots & \vdots & \ddots & \vdots \\ I & \sigma^{j-1} & \sigma^{2(j-1)} & \cdots & \sigma^{(j-1)(k-1)} \end{bmatrix}$$

where I is a unit matrix with p rows and p columns (p is a prime number: p=1, 3, 5, 7, 11, . . . ). j and k are a column weight and a row weight of the check matrix H, respectively, and satisfy a relation of j, k≦p, and σ is a cyclic permutation matrix with p rows and p columns obtained by moving "1"s of the unit the unit matrix I in a row or column direction. The following is an example in which "1"s are moved in the row direction:

$$\sigma = \begin{bmatrix} 0 & 1 & 0 & 0 & 0 \\ 0 & 0 & 1 & 0 & 0 \\ 0 & 0 & 0 & 1 & 0 \\ 0 & 0 & 0 & 0 & 1 \\ 1 & 0 & 0 & 0 & 0 \end{bmatrix}$$

The following is an example in which "1"s are moved in the row direction:

$$\sigma = \begin{bmatrix} 0 & 0 & 0 & 0 & 1 \\ 1 & 0 & 0 & 0 & 0 \\ 0 & 1 & 0 & 0 & 0 \\ 0 & 0 & 1 & 0 & 0 \\ 0 & 0 & 0 & 1 & 0 \end{bmatrix}$$

In the check matrix $H_1$, an element at the upper left corner is set as I (=$\sigma^0$). It is also possible that the element at the upper left corner of the check matrix $H_1$ is set to an arbitrary element $\sigma^n$ (n≦(j−1) (k−1)) and a matrix obtained by causing the remaining elements to cycle in the row or column direction is used as the check matrix $H_1$.

For example, when σ (=$\sigma^1$) is the element at the upper left corner, the remaining elements are caused to cycle as follows to generate the check matrix $H_1$.

$$H_1 = \begin{bmatrix} \sigma & \sigma^2 & \cdots & \sigma^{k-1} & I \\ \sigma^2 & \sigma^4 & \cdots & \sigma^{2(k-1)} & I \\ \vdots & \vdots & \ddots & \vdots & \vdots \\ \sigma^{j-1} & \sigma^{2(j-1)} & \cdots & \sigma^{(j-1)(k-1)} & I \\ I & I & \cdots & I & I \end{bmatrix}$$

where p is a prime number because, when p is not a prime number, a cyclic length of a cyclic permutation matrix in the check matrix $H_1$ is reduced and the check matrix $H_1$ has a 4 cycle if the check matrix $H_1$ is created using the cyclic permutation matrix.

However, when p is a prime number and a cyclic length of the cyclic permutation matrix is larger than the number of rows and columns of the check matrix $H_1$, the 4 cycle does not occur. This condition is represented as j, k≦p (p is a prime number). FIG. 1 is a diagram for explaining a cause of occurrence of the 4 cycle.

As shown in FIG. 1, it is seen that, whereas the 4 cycle does not occur in the matrix $H_1$ when p is a prime number 5, a cyclic length of the cyclic permutation matrix is reduced to cause the 4 cycle due to a cyclic matrix I when p is a non-prime number 6.

Such an array code defined by the check matrix $H_1$ with (j×p) rows and (k×p) columns, a column weight of which is j and a row weight of which is k, is a regular LDPC code and the number of rows and columns are limited. Thus, a part of the check matrix $H_1$ is sliced and used to thereby remove the limitation of the number of rows and columns and generate an irregular LDPC code, a column weight and a row weight of which are not uniform.

FIG. 2 is a diagram for explaining a method of generating the check matrix $H_1$. An example in which p=7, j=3, and k=4 and the check matrix $H_1$ with 16 rows and 24 columns is generated is shown in FIG. 2. When the check matrix $H_1$ is generated, first, a check matrix $H_{array}$ in an array code with 21 rows and 28 columns is generated using a cyclic permutation matrix with 7 rows and 7 columns. A matrix with 16 rows and 24 columns is sliced from the check matrix $H_{array}$ and set as the check matrix $H_1$.

On the other hand, the check matrix $H_2$ is a cyclic permutation matrix with a column weight 3. However, bit positions of "1" are determined such that there is no 4 cycle and an inverse matrix is sparse. A sparse matrix means a matrix in which the number of "1"s is extremely small and the number of "0"s is large. In this explanation, an inverse matrix, a column weight of which is 5, is selected as a sparse inverse matrix.

The check matrix $H_2$ shown below is an example in which a parity length is 16 and an initial value column is {0, 2, 6}.

$$H_2 = \begin{bmatrix} 1 & 0 & 1 & 0 & 0 & 0 & 1 & 0 & 0 & 0 & 0 & 0 & 0 & 0 & 0 & 0 \\ 0 & 1 & 0 & 1 & 0 & 0 & 0 & 1 & 0 & 0 & 0 & 0 & 0 & 0 & 0 & 0 \\ 0 & 0 & 1 & 0 & 1 & 0 & 0 & 0 & 1 & 0 & 0 & 0 & 0 & 0 & 0 & 0 \\ 0 & 0 & 0 & 1 & 0 & 1 & 0 & 0 & 0 & 1 & 0 & 0 & 0 & 0 & 0 & 0 \\ 0 & 0 & 0 & 0 & 1 & 0 & 1 & 0 & 0 & 0 & 1 & 0 & 0 & 0 & 0 & 0 \\ 0 & 0 & 0 & 0 & 0 & 1 & 0 & 1 & 0 & 0 & 0 & 1 & 0 & 0 & 0 & 0 \\ 0 & 0 & 0 & 0 & 0 & 0 & 1 & 0 & 1 & 0 & 1 & 0 & 1 & 0 & 0 & 0 \\ 0 & 0 & 0 & 0 & 0 & 0 & 0 & 1 & 0 & 1 & 0 & 1 & 0 & 1 & 0 & 0 \\ 0 & 0 & 0 & 0 & 0 & 0 & 0 & 0 & 1 & 0 & 1 & 0 & 0 & 0 & 1 & 0 \\ 0 & 0 & 0 & 0 & 0 & 0 & 0 & 0 & 0 & 1 & 0 & 1 & 0 & 0 & 0 & 1 \\ 1 & 0 & 0 & 0 & 0 & 0 & 0 & 0 & 0 & 0 & 1 & 0 & 1 & 0 & 0 & 0 \\ 0 & 1 & 0 & 0 & 0 & 0 & 0 & 0 & 0 & 0 & 0 & 1 & 0 & 1 & 0 & 0 \\ 0 & 0 & 1 & 0 & 0 & 0 & 0 & 0 & 0 & 0 & 0 & 0 & 1 & 0 & 1 & 0 \\ 0 & 0 & 0 & 1 & 0 & 0 & 0 & 0 & 0 & 0 & 0 & 0 & 0 & 1 & 0 & 1 \\ 1 & 0 & 0 & 0 & 1 & 0 & 0 & 0 & 0 & 0 & 0 & 0 & 0 & 0 & 1 & 0 \\ 0 & 1 & 0 & 0 & 0 & 1 & 0 & 0 & 0 & 0 & 0 & 0 & 0 & 0 & 0 & 1 \end{bmatrix}$$

The initial value column {0, a, b} (0<a, b<M, and a<b) is information for specifying a column on which bits of three "1"s are located on a first row of a cyclic permutation matrix, a column weight of which is 3. Specifically, the initial value column {0, a, b} indicates that elements of a first column, an a+1 th column, and a b+1 th column on a first row of the check matrix $H_2$ are "1" and the other elements are "0".

Since the check matrix $H_2$ is a cyclic permutation matrix, it is possible to determine, when an initial value column is determined, all elements of the check matrix $H_2$ based on the initial value column. Therefore, an encoder does not need to hold values of all the elements of the check matrix $H_2$ and only has to hold information on the initial value column. Thus, it is possible to realize a reduction of the circuit scale.

An inverse matrix $H_2^{-1}$ of the check matrix $H_2$ is:

$$H_2^{-1} = \begin{bmatrix} 1 & 0 & 0 & 0 & 1 & 0 & 0 & 0 & 0 & 1 & 0 & 1 & 0 & 1 & 0 \\ 0 & 1 & 0 & 0 & 0 & 1 & 0 & 0 & 0 & 0 & 1 & 0 & 1 & 0 & 1 \\ 1 & 0 & 1 & 0 & 0 & 0 & 1 & 0 & 0 & 0 & 0 & 1 & 0 & 1 & 0 \\ 0 & 1 & 0 & 1 & 0 & 0 & 0 & 1 & 0 & 0 & 0 & 0 & 1 & 0 & 1 \\ 1 & 0 & 1 & 0 & 1 & 0 & 0 & 0 & 1 & 0 & 0 & 0 & 0 & 1 & 0 \\ 0 & 1 & 0 & 1 & 0 & 1 & 0 & 0 & 0 & 1 & 0 & 0 & 0 & 0 & 1 \\ 1 & 0 & 1 & 0 & 1 & 0 & 1 & 0 & 0 & 0 & 1 & 0 & 0 & 0 & 0 \\ 0 & 1 & 0 & 1 & 0 & 1 & 0 & 1 & 0 & 0 & 0 & 1 & 0 & 0 & 0 \\ 0 & 0 & 1 & 0 & 1 & 0 & 1 & 0 & 1 & 0 & 0 & 0 & 1 & 0 & 0 \\ 0 & 0 & 0 & 1 & 0 & 1 & 0 & 1 & 0 & 1 & 0 & 0 & 0 & 1 & 0 \\ 0 & 0 & 0 & 0 & 1 & 0 & 1 & 0 & 1 & 0 & 1 & 0 & 0 & 0 & 1 \\ 1 & 0 & 0 & 0 & 0 & 1 & 0 & 1 & 0 & 1 & 0 & 1 & 0 & 0 & 0 \\ 0 & 1 & 0 & 0 & 0 & 0 & 1 & 0 & 1 & 0 & 1 & 0 & 1 & 0 & 0 \\ 0 & 0 & 1 & 0 & 0 & 0 & 0 & 1 & 0 & 1 & 0 & 1 & 0 & 1 & 0 \\ 0 & 0 & 0 & 1 & 0 & 0 & 0 & 0 & 1 & 0 & 1 & 0 & 1 & 0 & 1 \end{bmatrix}$$

In this way, when the check matrix $H_2$ is the matrix with the initial value column {0, 2, 6}, a column weight of the inverse matrix $H_2^{-1}$ is 5. Like the check matrix $H_2$, the inverse matrix $H_2^{-1}$ is also a cyclic permutation matrix. Therefore, the encoder only has to hold information on an initial value column to generate the inverse matrix $H_2^{-1}$. Thus, it is possible to realize a reduction in the circuit scale and an increase in speed of an arithmetic operation.

An initial value column of the cyclic permutation matrix $H_2$ with a column weight 3, which has no 4 cycle and an inverse matrix of which exists and has a column weight 5, depends on a parity length. A relation between the parity length satisfying the condition and the initial value column is easily checked through search by a computer.

When the 4. cycle is permitted, it is possible to set a column weight of an inverse matrix to less than 5. Specifically, it is possible to reduce the column weight of the inverse matrix to 3. It is possible to make the inverse matrix sparse, reduce computational complexity related to encoding, and reduce the circuit scale by checking the cyclic permutation matrix $H_2$, the inverse matrix of which has the column weigh of 3 in this way, through the search by the computer and using the cyclic permutation matrix $H_2$.

A result of the search for an initial value column performed by the computer is described below. FIGS. 3A to 3D are diagrams of initial value columns {0, a, b} corresponding to various parity lengths M. In FIGS. 3A to 3D, the comma "," for marking off numerals of the initial value column {0, a, b} is omitted.

The cyclic permutation matrix $H_2$ with the column weight 3, the parity length of which is M and the initial value column of which is {0, a, b}, has the 4 cycle when any one of the following conditions is satisfied:

$$a=b-a \quad (1)$$

$$b-a=M-b \quad (2)$$

$$M-b=a \quad (3)$$

$$b=M-b \quad (4)$$

$$M-a=a \quad (5)$$

$$M-b+a=b-a. \quad (6)$$

Therefore, at the time of search for an initial value column, an initial value column satisfying such a condition is excluded.

FIG. 4 is a functional block diagram of an encoder that generates an LDPC code according to the emobdiment. The encoder corresponds to the LDPC encoder 1 shown in FIG. 7. The encoder includes an information sequence receiving unit 10, a storing unit 11, a matrix generating unit 12, a first matrix arithmetic unit 13, a second matrix arithmetic unit 14, and a code generating unit 15.

The information sequence receiving unit 10 receives an information sequence and outputs the information sequence received to the first matrix arithmetic unit 13 and the code generating unit 15, respectively. The storing unit 11 is a storage device like a memory and stores information concerning positions of "1" in the cyclic permutation matrix σ used for generation of the check matrix $H_1$, information on an initial value column of the inverse matrix $H_2^{-1}$ of the check matrix $H_2$, information on the numbers of rows and columns of the check matrix $H_1$ and the inverse matrix $H_2^{-1}$, and the like.

The matrix generating unit 12 acquires the information concerning positions of "1" in the cyclic permutation matrix σ and the information on the number of rows and columns of the check matrix $H_1$ from the storing unit 11, generates the check matrix $H_1$ according to the method explained with reference to FIG. 2, and outputs a transposed matrix $H_1^T$ of the check matrix $H_1$ generated to the first matrix arithmetic unit 13.

The matrix generating unit 12 acquires the information on an initial value column of the inverse matrix $H_2^{-1}$ of the check matrix $H_2$ and information on the number of rows and columns of the inverse matrix $H_2^{-1}$ from the storing unit 11, generates the inverse matrix $H_2^{-1}$ of the check matrix $H_2$ from the initial value column, and outputs a transposed matrix $(H_2^{-1})^T$ of the inverse matrix $H_2$ generated to the second matrix arithmetic unit 14.

The first matrix arithmetic unit 13 calculates a product of the information sequence acquired from the information sequence receiving unit 10 and the transposed matrix $H_1^T$ acquired from the matrix generating unit 12 and outputs information on the product to the second matrix arithmetic unit 14.

The second matrix arithmetic unit 14 acquires the information on the product from the first matrix arithmetic unit 13 and calculates a product of the product acquired and the transposed matrix $(H_2^{-1})^T$ acquired from the matrix generating unit 12. This product is a parity sequence. The second matrix arithmetic unit 14 outputs the parity sequence to the code generating unit 15.

The code generating unit 15 adds the parity sequence acquired from the second matrix arithmetic unit 14 to the information sequence acquired from the information sequence receiving unit 10 to thereby generate a code sequence and outputs the code sequence generated.

Figure 5:
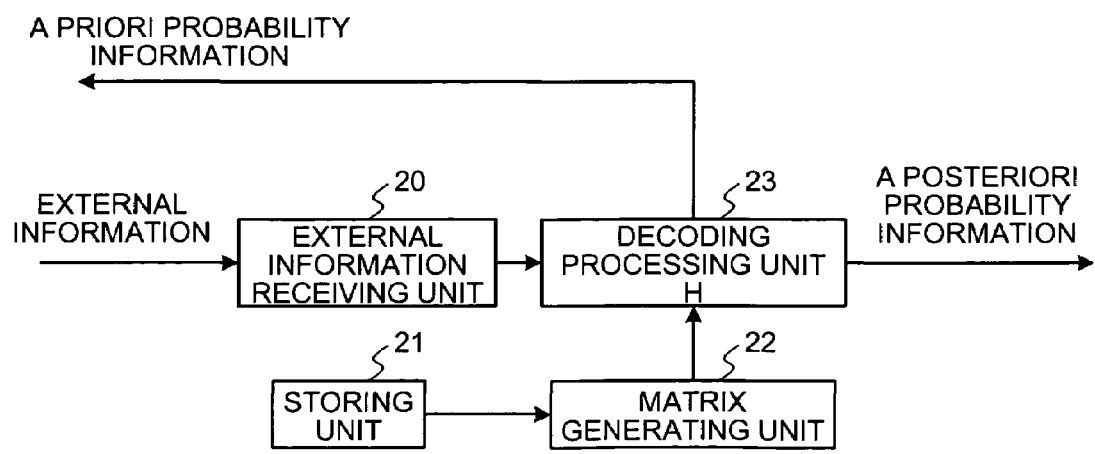
FIG. 5 is a functional block diagram of a decoder according to the first embodiment.
Figure 6:
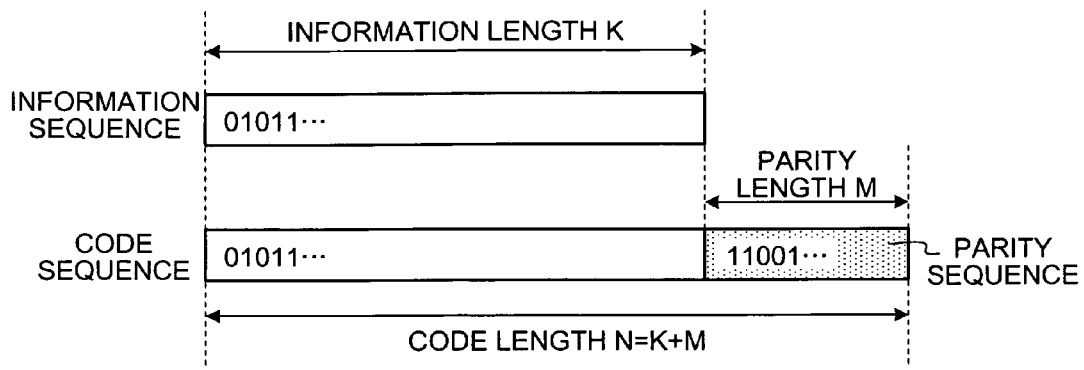
FIG. 6 is a diagram for explaining a systematic code.

FIG. 5 is a functional block diagram of a decoder that decodes an LDPC code according to the embodiment. The decoder corresponds to the LDPC decoder 4 shown in FIG. 7. The decoder includes an external information receiving unit 20, a storing unit 21, a matrix generating unit 22, and a decoding processing unit 23.

Figure 7:
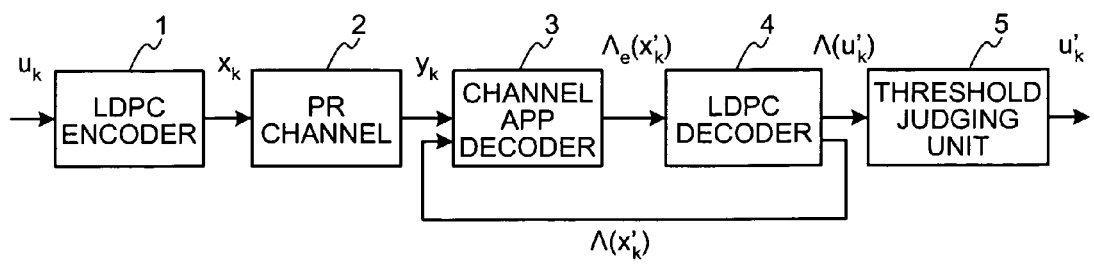
FIG. 7 is a functional block diagram of a conventional encoding/decoding section.
Figures 8, 9:
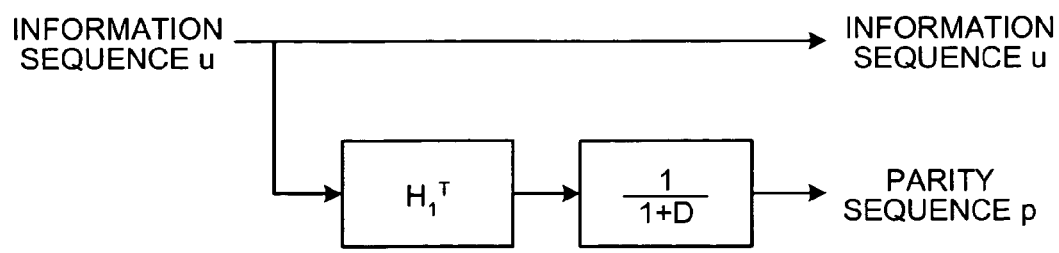
FIG. 8 is a diagram of an example of a check matrix H.
FIG. 9 is a diagram of a conventional encoder.

The external information receiving unit 20 receives external information from the channel APP decoder 3 shown in FIG. 7. The storing unit 21 is a storage device such as a memory and stores information concerning positions of "1" in the cyclic permutation matrix σ used for generation of the check matrix $H_1$, information on an initial value column of the check matrix $H_2$, information on the numbers of rows and columns of the check matrix $H_1$ and the check matrix $H_2$, and the like.

The matrix generating unit 22 generates the check matrix H based on the information concerning positions of "1" in the cyclic permutation matrix σ, the information on an initial value column of the check matrix $H_2$, and the information on the numbers of rows and columns of the check matrix $H_1$ and the check matrix $H_2$ and outputs the check matrix H generated to the decoding processing unit 23.

The decoding processing unit 23 decodes an LDPC code according to the Sum-Product decoding method generally used. Specifically, the decoding processing unit 23 performs reliability propagation operation with the external information as a priori likelihood using the check matrix H acquired from the matrix generating unit 22 and updates the external information with respect to the LDPC code sequence $x_k$.

The decoding processing unit 23 calculates a posteriori probability of an estimated value with respect to the information sequence based on the external information. The decoding processing unit 23 outputs the external information updated such that the external information is used as a priori information.

The decoding processing unit 23 repeats the processing a predetermined number of times and, then, outputs information on the a posteriori probability to the threshold judging unit 5 shown in FIG. 7. The threshold judging unit 5 having received this information can obtain an estimated value with respect to the information sequence by performing threshold judgment for the a posteriori probability. Consequently, decoding of the LDPC code is performed.

As described above, in the first embodiment, the first matrix arithmetic unit 13 and the second matrix arithmetic unit 14 of the encoder acquire information concerning the generator matrix of the LDPC code defined by the check matrix H with M rows and N columns formed by the check matrix $H_2$ with M rows and M columns that is a cyclic permutation matrix, an inverse matrix of which exists and a column weight of which is 3, and the check matrix $H_1$ with M rows and K columns and encode a predetermined information sequence into a code sequence based on the information acquired. Thus, it is possible to control error propagation among bits by setting the column weight to 3 even when there is intersymbol interference, improve error floor characteristic to prevent a decline in error correction ability, reduce computational complexity related to encoding by structuring the first matrix, and reduce the circuit scale.

In the first embodiment, the decoding processing unit 23 of the decoder acquires information concerning the check matrix H of the LDPC code defined by the check matrix H with M rows and N columns formed by the check matrix $H_2$ with M rows and M columns that is a cyclic permutation matrix, an inverse matrix of which exists and a column weight of which is 3, and the check matrix $H_1$ with M rows and K columns and decodes a code sequence based on the information acquired. Thus, it is possible to control error propagation among bits by setting the column weight to 3 even when there is intersymbol interference, improve error floor characteristic to prevent a decline in error correction ability, reduce computational complexity related to decoding by structuring the first matrix, and reduce the circuit scale.

In the first embodiment, when occurrence of a cycle, length of which is 4, is permitted in the Tanner graph, the inverse matrix of the check matrix $H_2$ is a matrix, a column weight of which is 3. Thus, it is possible to set the inverse matrix as a sparse matrix and reduce computational complexity related to encoding.

In the first embodiment, the check matrix $H_2$ is a cyclic permutation matrix with a column weight 3, elements of a first column, an a+1 th column, and a b+1 th column on a first column (0<a, b<M, and a<b) of which are 1 and other elements on the first row of which is 0. Thus, it is possible to generate the first matrix simply by storing positions of elements of 1 on the first row and it is possible to reduce the circuit scale because it is unnecessary to store all elements of the first matrix.

In the first embodiment, the check matrix $H_2$ is a matrix formed not to satisfy a condition under which a cycle, length of which is 4, occurs in the Tanner graph. Thus, it is possible to prevent deterioration in decoding performance.

In the first embodiment, a condition under which a cycle, length of which is 4, occurs is that any one of a=b−a, b−a=M−b, M−b=a, b=M−b, M−a=a, and M−b+a=b−a is satisfied. Thus, it is possible to efficiently prevent deterioration in decoding performance by generating the first matrix not to satisfy this condition.

In the first embodiment, when the check matrix $H_2$ is a matrix formed not to satisfy a condition under which a cycle, length of which is 4, occurs in the Tanner graph, an inverse matrix of the check matrix $H_2$ is a matrix, a column weight of which is 5. Thus, it is possible to set the inverse matrix as a sparse matrix and reduce computational complexity related to encoding.

In the first embodiment, the first matrix arithmetic unit 13 encodes an information sequence using the check matrix $H_1$ and, then, the second matrix arithmetic unit 14 further encodes the information sequence using an inverse matrix of the check matrix $H_2$ to thereby generate a parity sequence. The code generating unit 15 adds the parity sequence generated to the information sequence to thereby encode a predetermined information sequence into a code sequence. Thus, it is possible to efficiently perform encoding of an information sequence using the check matrix $H_2$ and the check matrix $H_1$ that form a check matrix with M rows and N columns.

In the first embodiment, the check matrix $H_1$ is a matrix generated by slicing a matrix with M rows and K columns from the check matrix $H_{array}$ with P rows and Q columns (M<P and K<Q) in an array code. Thus, it is possible to set the check matrix $H_1$ as an irregular LDPC code, a column weight and a row weight of which are not uniform.

In the first embodiment, the check matrix H is structured. However, if structuring is simply performed, randomness of a check matrix may fall to make it difficult to improve error correction ability.

There is the random interleaver as a technology for improving randomness of a check matrix. However, since it is necessary to prepare a plurality of memories that store code sequences, the circuit scale is increased. Therefore, in a second embodiment, randomness of a check matrix is improved without increasing the circuit scale. Functional constitutions of an encoder and a decoder are the same as those shown in FIGS. 4 and 5. Differences from the first embodiment are explained in detail below.

First, the check matrix H according to the second embodiment is explained. As in the first embodiment, the check matrix H with M rows and N columns is divided into the check matrix $H_2$ that is a square matrix with M rows and M columns and the check matrix $H_1$ with the remaining M rows and K columns (K=N−M) as shown below:

$$H = [H_1 H_2].$$

A matrix same as the check matrix $H_2$ in the first embodiment is used as the check matrix $H_2$ in the second embodiment. The check matrix $H_1$ is formed as follows by a product of respective column blocks of the check matrix $H_{array}$ in an array code and $\omega^m$ ($0 \leq m \leq k-1$) formed by a cyclic permutation matrix $\omega$ explained later.

$$H_1 = \begin{bmatrix} I & I\omega & I\omega^2 & \cdots & I\omega^{k-1} \\ I & \sigma\omega & \sigma^2\omega^2 & \cdots & \sigma^{k-1}\omega^{k-1} \\ I & \sigma^2\omega & \sigma^4\omega^2 & \cdots & \sigma^{2(k-1)}\omega^{k-1} \\ \vdots & \vdots & \vdots & \ddots & \vdots \\ I & \sigma^{j-1}\omega & \sigma^{2(j-1)}\omega^2 & \cdots & \sigma^{(j-1)(k-1)}\omega^{k-1} \end{bmatrix}$$

where I is a unit matrix with p rows and p columns (p is a prime number: p=1, 3, 5, 7, 11, . . . ). j and k are a column weight and a row weight of the check matrix H, respectively, and satisfy a relation of j, k≦p.

As shown in an example below, σ is a cyclic permutation matrix with p rows and p columns same as that in the first embodiment that forms an array code.

$$\sigma = \begin{bmatrix} 0 & 1 & 0 & 0 & 0 \\ 0 & 0 & 1 & 0 & 0 \\ 0 & 0 & 0 & 1 & 0 \\ 0 & 0 & 0 & 0 & 1 \\ 1 & 0 & 0 & 0 & 0 \end{bmatrix}$$

The cycle permutation matrix ω is a matrix with p rows and p columns and is a matrix obtained by subjecting two "1"s on rows adjacent to each other in the cyclic permutation matrix σ to row or column permutation arrangement to be arranged predetermined columns apart from each other. For example, the cyclic permutation matrix ω obtained by subjecting two "1"s on rows adjacent to each other to row or column permutation arrangement to be arranged one column apart from each other is represented as below:

$$\omega = \begin{bmatrix} 0 & 1 & 0 & 0 & 0 \\ 0 & 0 & 0 & 1 & 0 \\ 1 & 0 & 0 & 0 & 0 \\ 0 & 0 & 1 & 0 & 0 \\ 0 & 0 & 0 & 0 & 1 \end{bmatrix}$$

In the cyclic matrix σ in the first embodiment, "1"s are arranged on a diagonal. However, it it is possible to disperse "1"s arranged on the diagonal by using such a pseudo-random cyclic permutation matrix ω and imitate the random interleaver. This is effective for improvement of error correction ability when there is intersymbol interference as in codes in a magnetic disk device. As explained with reference to FIG. 2, it is also possible to slice an arbitrary part of the check matrix $H_1$ and use the part as the check matrix $H_1$.

The encoder and the decoder shown in FIGS. 4 and 5 perform encoding of an information sequence and decoding of a code sequence using the generator matrix G corresponding to the check matrix H formed in this way and the check matrix H.

Thus, in the second embodiment, the first matrix arithmetic unit 13 and the second matrix arithmetic unit 14 of the encoder acquire information concerning the generator matrix defined by the check matrix H formed by the matrix ω, which is obtained by subjecting two "1"s on rows adjacent to each other in the cyclic permutation matrix σ that forms the check matrix $H_{array}$ in an array code to row or column permutation arrangement to be arranged predetermined columns apart from each other, and encode an information sequence into a code sequence based on the information acquired. Thus, it is possible to imitate the random interleaver, prevent a decline in error correction ability by controlling error propagation among bits even when there is intersymbol interference, reduce computational complexity related to encoding by structuring a matrix, and reduce the circuit scale.

In the second embodiment, the matrix generating unit 12 of the encoder generates information concerning a generator matrix by calculating a product of the matrix ω, which is obtained by subjecting two "1"s on rows adjacent to each other in the cyclic permutation matrix σ that forms the check matrix $H_{array}$ in an array code to row or column permutation arrangement to be arranged predetermined columns apart from each other, and the cyclic permutation matrix σ. The first matrix arithmetic unit 13 and the second matrix arithmetic unit 14 acquire the information generated. Thus, it is possible to make a storage device in which the information concerning the generator matrix is stored in advance unnecessary.

The embodiments of the present invention have been explained. The present invention may be carried out in various different embodiments within a scope of the technical idea described in patent claims other than the embodiments described above. For example, the present invention is not limited to the application to error correction for a magnetic disk device and may be applied to error correction for an optical disk storage device and communication.

Among the respective kinds of processing explained in the embodiments, all or a part of the kinds of processing explained as being automatically performed may be manually performed. All or a part of the kinds of processing explained as manually performed may be automatically performed according to a publicly known method.

Besides, it is possible to arbitrarily change the processing procedures, the control procedures, the specific names, and the information including various data and parameters unless specifically noted otherwise.

The respective components of the encoder and the decoder shown in the figures are functionally conceptual and are not always required to be physically constituted as shown in the figure. In other words, specific forms of distribution and integration of the encoder and the decoder are not limited to those shown in the figures. It is possible to constitute all or a part of the devices to be functionally or physically distributed and integrated by an arbitrary unit according to various loads, states of use, and the like.

Moreover, all or a part of the various processing functions performed in the encoder and the decoder can be realized by a CPU and programs analyzed and executed by the CPU or can be realized as hardware according to the wired logic.

According to the present invention, the encoder acquires information concerning a generator matrix of an LDPC code defined by a check matrix with M rows and N columns formed by a first matrix with M rows and M columns that is a cyclic permutation matrix, an inverse matrix of which is present and a column weight of which is 3, and a second matrix with M rows and K columns and encodes a predetermined information sequence with a code sequence based on the information acquired. Thus, there is an effect that it is possible to control error propagation among bits by setting the column weight to 3 even when there is intersymbol inter-ference, improve error floor characteristic to prevent a decline in error correction ability, reduce computational complexity related to encoding by structuring the first matrix, and reduce the circuit scale.

According to the present invention, the decoder acquires information concerning a check matrix with M rows and N columns of an LDPC code defined by the check matrix formed by a first matrix with M rows and M columns that is a cyclic permutation matrix, an inverse matrix of which is present and a column weight of which is 3, and a second matrix with M rows and K columns and decodes a code sequence based on the information acquired. Thus, there is an effect that it is possible to control error propagation among bits by setting the column weight to 3 even when there is intersymbol interference, improve error floor characteristic to prevent a decline in error correction ability, reduce computational complexity related to decoding by structuring the first matrix, and reduce the circuit scale.

According to the present invention, an inverse matrix of the first matrix is a matrix, a column weight of which is 3. Thus, there is an effect that it is possible to set the inverse matrix as a sparse matrix and reduce computational complexity related to encoding.

According to the present invention, the first matrix is a cyclic permutation matrix with a column weight 3, elements of a first column, an a+1th column, and a b+1th column on a first row (0<a, b<M, and a<b) of which are 1 and other elements on the first row of which is 0. Thus, there is an effect that it is possible to generate the first matrix simply by storing positions of elements of 1 on the first row and it is possible to reduce the circuit scale because it is unnecessary to store all elements of the first matrix.

According to the present invention, the first matrix is a matrix formed not to satisfy a condition under which a cycle, length of which is 4, occurs in the Tanner graph. Thus, there is an effect that it is possible to prevent deterioration in decoding performance.

According to the present invention, a condition under which a cycle, length of which is 4, occurs is that any one of a=b−a, b−a=M−b, M−b=a, b=M−b, M−a=a, and M−b+a=b−a is satisfied. Thus, there is an effect that it is possible to efficiently prevent deterioration in decoding performance by generating the first matrix not to satisfy this condition.

According to the present invention, when the first matrix is a matrix formed not to satisfy a condition under which a cycle, length of which is 4, occurs in the Tanner graph, an inverse matrix of the first matrix is a matrix, a column weight of which is 5. Thus, there is an effect that it is possible to set the inverse matrix as a sparse matrix and reduce computational complexity related to encoding.

According to the present invention, after encoding an information sequence using the second matrix, the information sequence is further encoded using an inverse matrix of the first matrix to thereby generate a parity sequence, a predetermined information sequence is encoded into a code sequence by adding the parity sequence generated to the information sequence. Thus, there is an effect that it is possible to efficiently perform encoding for an information sequence using the first matrix and the second matrix that forms the check matrix with M rows and N columns.

According to the present invention, the second matrix is formed by a matrix obtained by subjecting two "1"s on rows adjacent to each other in a cyclic permutation matrix that forms a check matrix in an array code to row or column permutation arrangement to be arranged predetermined columns apart from each other. Thus, there is an effect that it is possible to imitate the random interleaver and prevent a decline in error correction ability by controlling error propagation among bits even when there is intersymbol interference.

According to the present invention, the second matrix is a matrix generated by slicing a matrix with M rows and K columns from a check matrix with P rows and Q columns (M<P and K<Q) in an array code. Thus, there is an effect that it is possible to set the second matrix as an irregular LDPC code, a column weight and a row weight of which are not uniform.

According to the present invention, information concerning a generator matrix defined by a check matrix formed by a matrix obtained by subjecting two "1"s on rows adjacent to each other in a cyclic permutation matrix that forms a check matrix in an array code to row or column permutation arrangement to be arranged predetermined columns apart from each other is acquired and an information sequence is encoded into a code sequence based on the information acquired. Thus, there is an effect that it is possible to imitate the random interleaver, prevent a decline in error correction ability by controlling error propagation among bits even when there is intersymbol interference, reduce computational complexity related to encoding by structuring a matrix, and reduce the circuit scale.

According to the present invention, information concerning a generator matrix is generated by calculating a product of a matrix obtained by subjecting two "1"s on rows adjacent to each other in a cyclic permutation matrix that forms a check matrix in an array code to row or column permutation arrangement to be arranged predetermined columns apart from each other and the cyclic permutation matrix and the information generated is acquired. Thus, there is an effect that it is possible to make a storage device in which the information concerning the generator matrix is stored in advance unnecessary.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. An encoder that encodes an information sequence having an information length of K into a code sequence having a code length of N (N=K+M), where M is parity length by using a low-density parity-check (LDPC) code, the encoder comprising:
   an information acquiring unit that acquires information concerning a generator matrix of an LDPC code defined by a check matrix with M rows and N columns formed by a first matrix with M rows and M columns that is a cyclic permutation matrix, an inverse matrix of which exists and a column weight of which is 3, and a second matrix with M rows and K columns; and
   an encoding unit that encodes the information sequence into the code sequence based on the information acquired by the information acquiring unit.

2. The encoder according to claim 1, wherein the first matrix is a cyclic permutation matrix with a column weight 3 elements of a first column, an a+1th column, and a b+1th column on a first row (0<a, b<M, and a<b) of which are 1 and other elements on the first row of which is 0.

3. The encoder according to claim 1, wherein an inverse matrix of the first matrix is a matrix, a column weight of which is 3.

4. The encoder according to claim 1, wherein the first matrix is a matrix formed not to satisfy a condition under which a cycle, length of which is 4, occurs in a Tanner graph.

5. The encoder according to claim 4, wherein a condition under which a cycle, length of which is 4, occurs is that any one of a=b−a, b−a=M−b, M−b=a, b=M−b, M−a=a, and M−b=a=b−a is satisfied.

6. The encoder according to claim 4, wherein an inverse matrix of the first matrix is a matrix, a column weight of which is 5.

7. The encoder according to claim 1, wherein the encoding unit encodes the information sequence using the second matrix and, then, further encodes the information sequence using an inverse matrix of the first matrix to thereby generate a parity sequence and adds the parity sequence generated to the information sequence to thereby encode the predetermined information sequence into an LDPC code.

8. The encoder according to claim 1, wherein the second matrix is a matrix generated by slicing a matrix with M rows and K columns from a check matrix with P rows and Q columns (M<P and K<Q) in an array code.

9. An encoder that encodes an information sequence using an array code, comprising:
   an information acquiring unit that acquires information concerning a generator matrix defined by a first check matrix formed by a matrix obtained by applying row or column permutation arrangement to a cyclic permutation matrix that forms a second check matrix of array code, so that, a "1" on a first row is positioned predetermined columns apart from a "1" on a second row adjacent to the first row in the cyclic permutation matrix;
   an encoding unit that encodes the information sequence into a code sequence based on the information acquired by the information acquiring unit.

10. The encoder according to claim 9, further comprising an information generating unit that generates the information concerning the generator matrix by calculating a product of a matrix obtained by applying row or column permutation arrangement to a cyclic permutation matrix that forms the second check matrix of array code, so that, a "1" on a first row is positioned predetermined columns apart from a "1" on a second row adjacent to the first row in the cyclic permutation matrix and the cyclic permutation matrix, wherein the information acquiring unit acquires the information generated by the information generating unit.

11. A decoder that decodes a code sequence to an information sequence having an information length of K, wherein the information seciuence is encoded by using a low-density parity-check (LDPC) code into the code sequence having a code length of N (N=K+M), where M is parity length, the decoder comprising:
   an information acquiring unit that acquires information concerning a check matrix with M rows and N columns of an LDPC code defined by the check matrix formed by a first matrix with M rows and M columns that is a cyclic permutation matrix, an inverse matrix of which exists and a column weight of which is 3, and a second matrix with M rows and K columns; and
   a decoding unit that decodes the code sequence based on the information acquired by the information acquiring unit.

12. The decoder according to claim 11, wherein the first matrix is a cyclic permutation matrix with a column weight 3, elements of a first column, an a+1th column, and a b+1th column on a first row (0<a, b<M, and a<b) of which are 1 and other elements on the first row of which is 0.

13. The decoder according to claim 12, wherein an inverse matrix of the first matrix is a matrix, a column weight of which is 3.

14. The decoder according to claim 11, wherein the first matrix is a matrix formed not to satisfy a condition under which a cycle, length of which is 4, occurs in a Tanner graph.

15. The decoder according to claim 14, wherein a condition under which a cycle, length of which is 4, occurs is that any one of a=b−a, b−a=M−b, M−b=a, b=M−b, M−a=a, and M−b+a=b−a is satisfied.

16. The decoder according to claim 14, wherein an inverse matrix of the first matrix is a matrix, a column weight of which is 5.

17. The decoder according to claim 11, wherein the second matrix is formed by a matrix obtained by applying row or column permutation arrangement to a cyclic permutation matrix that forms a check matrix of array code, so that, a "1" on a first row is positioned predetermined columns apart from a "1" on a second row adjacent to the first row in the cyclic permutation matrix.

18. The decoder according to claim 11 wherein the second matrix is a matrix generated by slicing a matrix with M rows and K columns from a check matrix with P rows and Q columns (M<P and K<Q) in an array code.

19. A method of encoding including adding a parity sequence, a parity length of which is M, to an information sequence, an information length of which is K, and thereby encoding the information sequence into a code sequence, a code length of which is N (N=K+M), using a low-density parity-check (LDPC) code, the method comprising:

acquiring information concerning a generator matrix of an LDPC code defined by a check matrix with M rows and N columns formed by a first matrix with M rows and M columns that is a cyclic permutation matrix, an inverse matrix of which exists and a column weight of which is 3, and a second matrix with M rows and K columns; and encoding the information sequence into the code sequence based on the information acquired at the acquiring.

20. A method of decoding a code sequence to an information sequence having an information length of K, wherein the information sequence is encoded using a low-density parity-check (LDPC) code into the code sequence having a code length of N (N=K+M), where M is parity length, the method comprising:

acquiring information concerning a check matrix with M rows and N columns of an LDPC code defined by the check matrix formed by a first matrix with M rows and M columns that is a cyclic permutation matrix, an inverse matrix of which exists and a column weight of which is 3, and a second matrix with M rows and K columns; and decoding the code sequence based on the information acquired at the acquiring.

\* \* \* \* \*